United States Patent [19]

Kurihara

[11] Patent Number: 4,602,220
[45] Date of Patent: Jul. 22, 1986

[54] VARIABLE FREQUENCY SYNTHESIZER WITH REDUCED PHASE NOISE

[75] Inventor: Takenori Kurihara, Gyoda, Japan

[73] Assignee: Advantest Corp., Tokyo, Japan

[21] Appl. No.: 765,502

[22] Filed: Aug. 14, 1985

[30] Foreign Application Priority Data

Aug. 22, 1984 [JP] Japan ............................ 59-127979[U]

[51] Int. Cl.$^4$ ............................................. H03L 7/16
[52] U.S. Cl. .......................................... 331/19; 331/25; 331/47; 331/50; 331/76
[58] Field of Search ................... 331/2, 18, 19, 22, 25, 331/37, 47, 48, 50, 53, 76, 177 R; 328/14, 16

[56] References Cited

U.S. PATENT DOCUMENTS

| 3,365,676 | 1/1968 | Buss | 331/22 |
| 3,676,794 | 7/1972 | Bidell et al. | 331/19 X |
| 4,458,329 | 7/1984 | Remy | 328/14 X |
| 4,551,689 | 11/1985 | Scala et al. | 331/2 |

FOREIGN PATENT DOCUMENTS

| 3230772 | 2/1984 | Fed. Rep. of Germany | 331/18 |
| 0839422 | 6/1960 | United Kingdom | 331/2 |

*Primary Examiner*—Eugene R. LaRoche
*Assistant Examiner*—D. C. Mis
*Attorney, Agent, or Firm*—Staas & Halsey

[57] ABSTRACT

A reference signal from a reference signal source is supplied to a frequency transformer and a side band signal generator. The frequency transformer is formed mainly by up-converters and produces a frequency m times as high as the frequency $f_s$ of the reference signal. The side band signal generator outputs signals of base and harmonic frequencies $f_s$, $2f_s$, $3f_s$, ... and $nf_s$ (where n is less than m) and produces less phase noise than does the frequency transformer. The outputs of the frequency transformer and the side band signal generator are frequency mixed by a frequency mixer, and one frequency component in the frequency-mixed output is selected by a variable filter.

20 Claims, 13 Drawing Figures

VARIABLE FREQUENCY SYNTHESIZER WITH REDUCED PHASE NOISE

BACKGROUND OF THE INVENTION

The present invention relates to a variable frequency synthesizer which is used as a local oscillator of a spectrum analyzer or a test signal generator for producing signals of frequencies above the VHF band, and more particularly to a variable frequency synthesizer which is excellent in SSB phase-noise characteristic.

The variable frequency synthesizer of the present invention is used singly as a variable frequency synthesizer in itself but can be used as a part of a frequency synthesizing system as well.

Figure 1:
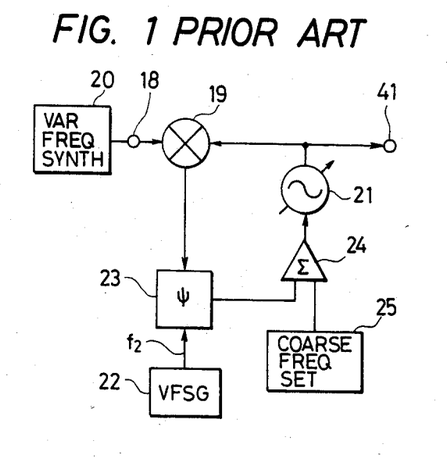
FIG. 1 is a block diagram illustrating a conventional signal generator employing a conventional variable frequency synthesizer 20.

In a prior art signal generator, as shown in FIG. 1, a signal from a variable frequency synthesizer 20 is applied via a terminal 18 to a frequency mixer 19, wherein it is frequency mixed with the output of a voltage-controlled variable oscillator (VCO) 21. The output of the voltage-controlled variable oscillator 21 is converted by the frequency mixer 19 to a signal of a lower frequency, which is provided to a phase comparator 23, wherein it is phase compared with a reference signal of a frequency $f_2$ from a variable reference signal generator 22. The phase-compared output is applied to an adder 24, wherein it is added to a DC signal from a coarse frequency setting circuit 25, and the added output is provided as a frequency control signal to the voltage-controlled variable oscillator 21. For example, the variable frequency synthesizer 20 varies, by steps of 200 MHz, its output signal frequency ranging from 1800 to 3800 MHz, the variable reference signal generator 22 varies, by steps of 1 KHz, its output signal frequency ranging from 200 to 300 MHz and the coarse frequency setting circuit 25 sets an approximate value of the frequency to be created, that is, a value of the higher-order digits of the frequency value to be generated. Thus the output frequency $f_0$ of the VCO 21 can be varied in the range of between 2000 to 4000 MHz by the steps of 1 KHz, and the output of such a frequency is provided to an output terminal 41.

Figure 2:
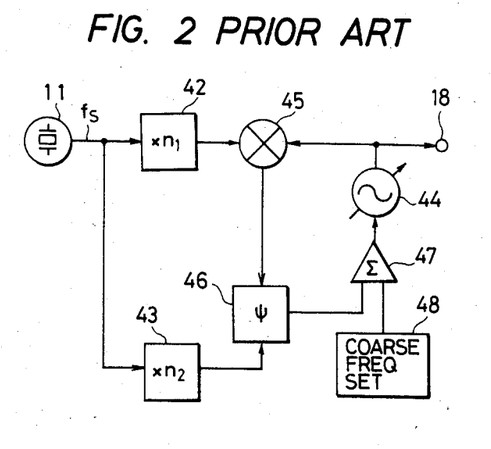
FIG. 2 is a block diagram showing the conventional frequency synthesizer 20 used in the signal generator depicted in FIG. 1.

As the variable frequency synthesizer 20, a frequency synthesizer is employed, which has heretofore been arranged, as shown in FIG. 2. A reference signal of a frequency $f_s$ is applied from a reference signal source 11 to each of frequency multipliers 42 and 43. The frequency multiplier 42 provides a signal of a frequency $n_1 f_s$, whereas the frequency multiplier 43 produces $n_2$ signals of frequencies $f_s, 2f_s, 3f_s, \ldots$ and $n_2 f_s$. The output signal of the frequency multiplier 42 and the output of a voltage-controlled variable oscillator 44 are applied to a frequency converter 45, wherein the output frequency of the variable oscillator 44 is lowered. The output of the frequency converter 45 is phase compared, by a phase comparator 46, with the output of the frequency multiplier 43. The phase-compared output is added, by an adder 47, to the DC output of a coarse frequency setting circuit 48. The added output is applied to the variable oscillator 44 to control its output frequency. By that one of the output signals of the frequency multiplier 43 which corresponds to the set value of the coarse frequency setting circuit 48 is effected loop control for the variable oscillator 44.

Assuming that the oscillation frequency $f_s$ of the reference signal source 11 is 100 MHz and the multiplication factors $n_1$ and $n_2$ are 18 and 20, respectively, the output frequency of the frequency multiplier 42 will by 1800 MHz. By suitable setting of the coarse frequency setting circuit 48, the oscillation frequency of the variable oscillator 44 can be varied in the range of 1800 to 3800 MHz at intervals of 100 MHz. At this time, the output frequency of the frequency converter 45 ranges from 0 to 2000 MHz.

As described above, the conventional variable frequency synthesizer 20 employs frequency multipliers which frequency-multiply the reference signal so as to derive signals of higher frequencies from the reference signal. In general, the reference signal has an instantaneous phase variation, which is also multiplied when the frequency is multiplied by a frequency multiplier. As a result, the output signal of the conventional frequency synthesizer is low in frequency purity.

SUMMARY OF THE INVENTION

It is an object of the present invention to provide a variable frequency synthesizer from which can be obtained an output signal of high frequency purity.

In accordance with the present invention, the reference signal of the frequency $f_s$ from the reference signal source is applied to a frequency transforming means formed mainly by up-converters, by which it is transformed into a frequency $f_1 = mf_s$ (where m is an integer equal to or greater than 3). Furthermore, the reference signal from the reference signal source is provided to a side band signal generating means, from which are generated signals of frequencies $f_s, 2f_s, 3f_s, \ldots$ and $nf_s$ (where $n < m$). The side band signal generating means is substantially equal to or lower than the abovesaid frequency transforming means in terms of the degree of generation of phase noise. The output signal of the side band signal generating means and the output signal of the frequency transforming means are frequency mixed by a frequency mixer. From the frequency-mixed output is derived by a variable filter one frequency component, which is provided as the output of the variable frequency synthesizer. As the side band signal generating means, a frequency multiplier with a low-order multiplying factor is employed, which factor is in the range of 0 to 10, or a structure formed mainly by up-converters as is the case with the frequency transforming means is utilized.

The variable frequency synthesizer of the present invention can be used alone if arranged to be capable of varying the reference signal frequency, or it can be used as a part of a signal generator.

DESCRIPTION OF THE PREFERRED EMBODIMENTS

Figure 3:
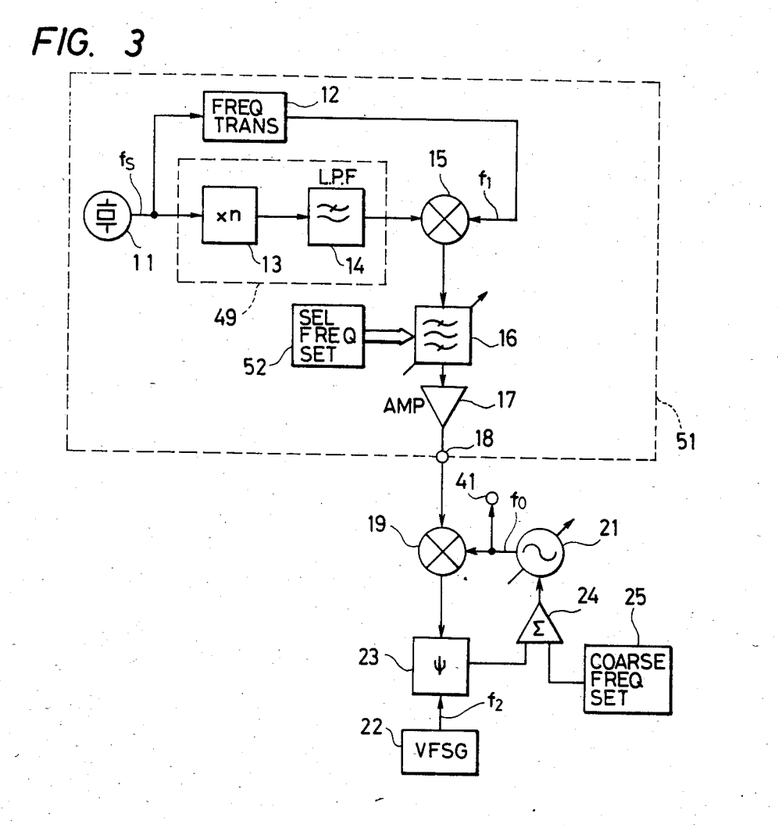
FIG. 3 is a block diagram illustrating a signal generator employing the variable frequency synthesizer of the present invention.

FIG. 3 illustrates a signal generator employing an embodiment of the variable frequency synthesizer 51 of the present invention. A reference signal source 11 produces a reference signal of a frequency $f_s$ which is high in frequency stability. The reference signal is frequency-transformed by a frequency transformer 12 to a signal of a frequency $f_1 = mf_s$ (where m is an integer equal to or greater than 3). In this instance, the frequency transformer 12 is selected for instance to have its phase noise not exceeding 20 log m [dB].

Figure 4A:
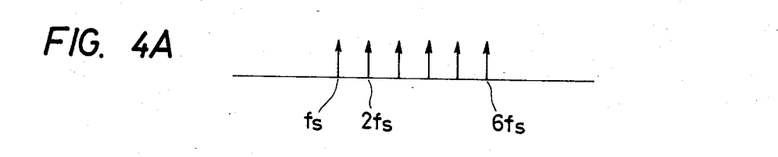
FIG. 4A is a diagram showing frequencies which are generated by a side band signal generator 49.
Figure 4B:
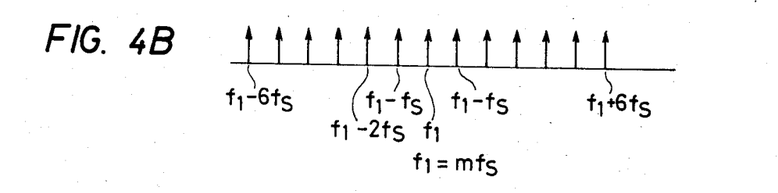
FIG. 4B is a diagram showing output frequencies of a frequency mixer 15.

The reference signal of the reference signal source 11 is applied as well to a side band signal generator 49 to output therefrom signals of frequencies $f_s$, $2f_s$, $3f_s$, ... and $nf_s$. In this example, the side band signal generator 49 is comprised of a low-order multiplier 13 and a low-pass filter 14. The reference signal is frequency multiplied by a factor n by the low-order multiplier 13, where n is a positive integer smaller than m, for instance, 10 or less, preferably, 0 to 7. For example, when $n=6$, the low-order multiplier 13 outputs six multiplied frequencies $f_s$, $2f_s$, ... and $6f_s$ via the low-pass filter 14, as shown in FIG. 4A. The outputs from the side band signal generator 49 and the frequency transformer 12 are frequency mixed by a frequency mixer 15. Accordingly, the output of the frequency mixer 15 includes the frequency $f_1$ and, at the higher and lower sides thereof, side band frequencies to which the output of the side band signal generator 14 has been frequency converted, as shown in FIG. 4B. A desired one of these frequency components is selected by a variable filter 16. The output of the variable filter 16 is provided to an output terminal 18 of the variable frequency synthesizer 51, if necessary, via a buffer amplifier 17.

FIG. 3 illustrates an embodiment of the variable frequency synthesizer 51 as applied in the signal generator depicted in FIG. 1. In FIG. 3 the parts corresponding to those in FIG. 1 are identified by the same reference numerals and no description will be repeated thereof. Incidentally, when a YIG or YTO oscillator is used as the voltage-controlled oscillator 21, its main tuning coil is supplied with the DC output of the coarse frequency setting circuit 25 and its FM coil supplied with the output of the phase comparator 23. A YIG tuning filter or a variable band-pass filter using a variable capacitance diode can be employed as the variable filter 16. In a selective frequency setting circuit 52 is set a value $(m \pm n_i)$ (where i=0, 1, ..., 6) so that any one of, for example, 13 frequencies $(m-n)f_s$ to $(m+n)f_s$, is obtained from the variable filter 16, and a value corresponding to the set value $(m \pm n_i)$ is set in the coarse frequency setting circuit 25. The output frequency of the variable oscillator 21 becomes $f_0 = (m \pm n_i)f_s + f_2$. By sequentially varying $(m \pm n_i)$ while interpolating between two adjacent $(m \pm n_i)f_s$ by varying the signal frequency $f_2$ of the variable reference signal generator 22, a frequency sweep signal is derived from the variable oscillator 21.

The frequency transformer 12 is formed by a circuit which is of less phase noise than in the case where the reference signal is directly frequency multiplied by a factor m, that is, it is constituted by up-converters with which the phase noise at the output of the frequency transformer 12 is less than $(20 \log m) \times \Delta\phi_s$, where $\Delta\phi_s$ is the phase noise of the reference signal source 11.

Figure 5:
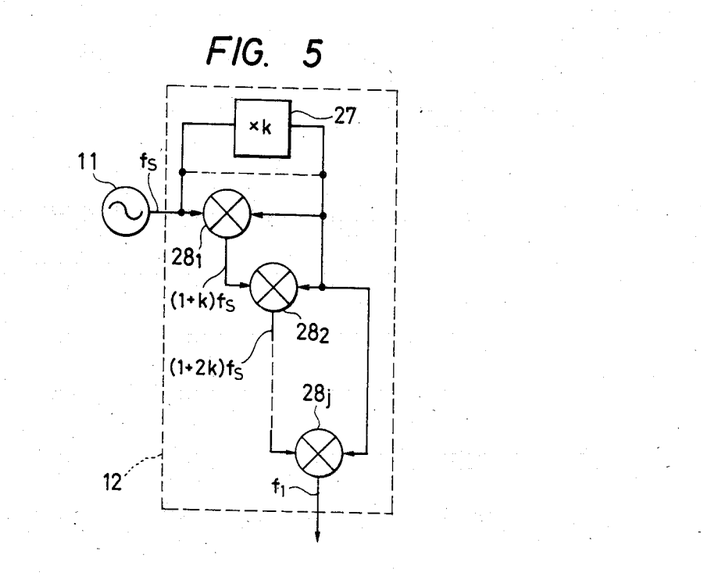
FIG. 5 is a block diagram illustrating an example of a frequency transformer 12 used in the present invention.

For example, as shown in FIG. 5, the reference signal supplied to the frequency transformer 12 is multiplied by a multiplier 27 by a factor k, and by the multiplied output, the frequency $f_s$ of the reference signal is increased by an up-converter $28_1$ to $f_s + kf_s$. The output of the up-converter $28_1$ is raised in frequency by an up-converter $28_2$ to $f_s + kf_s + kf_s$ based on the output of the multiplier 27. In a similar manner the outputs of the succeeding up-converters are sequentially raised in frequency by the output of the multiplier 27. In the above, k is 2 or 3. As described with respect to FIG. 5, the transformer 12 is arranged preferably such that at least one multiplier is provided which has such a small multiplication factor as 2 or 3 and a plurality of up-converters are cascade-connected so that each of their unmultiplied outputs and the multiplied output are frequency-mixed to gradually raise the reference signal frequency. In general, each of the up-converters is composed of a mixer for frequency-mixing two signals input thereto and a filter for extracting from the output of the mixer a sum component of the frequencies of the two signals.

In this case, the output frequency of the final-stage up-converter $28^j$ will be as follows:

$$f_1 = (f_s + kf_s) + kf_s + \ldots kf_s.$$

Letting the number of the up converters $28_1$, $28_2$, ... $28_j$ be represented by j, then $f_1 = f_s(1 + jk)$. Letting the instantaneous phase variation of the frequency $f_s$ of the reference signal from the reference signal source 11 be represented by $\Delta\phi_s$, an instantaneous phase variation $\Delta\phi_a$ of the output from the frequency transformer 12 shown in FIG. 5 is obtained as the square root of the sum of the power spectrum (square spectrum) of the inputs to the respective up-converters and the multiplier, as given below.

$$\Delta\phi_a = \sqrt{1 + jk^2} \times \Delta\phi_s$$

On the other hand, an instantaneous phase variation $\Delta\phi_b$ in the case of the reference signal being directly multiplied by a factor m is $m\Delta\phi_s$. Therefore, phase noise Sa of the frequency transformer 12 shown in FIG. 5 and phase noise Sb in the case of the frequency $f_s$ being directly multiplied by a factor m are as follows:

$$Sa = 10 \log [(1 + j \cdot k^2)\Delta\phi_s^2] = 10 \log(1 + j \cdot k^2) + 10 \log \Delta\phi_s^2$$

$$Sb = 10 \log [m^2\Delta\phi_s^2] = 10 \log \Delta\phi_s^2$$

Now a comparison will be made between the instantaneous phase noises in the case of the same frequency, that is, when $m = 1 + jk$. Assuming that $k=2$ and $m=11$, then $j=(11-1/2)=5$. Substituting $k=2$ and $j=5$ for Sa and Sb, $$Sa = 10 \log(1 + jk^2) = 10 \log(1 + 5 \times 2^2) = 13.2 \text{ dB}$$

$Sb = 10 \log m^2 = 10 \log 11^2 = 20.8$ dB

Figure 6:
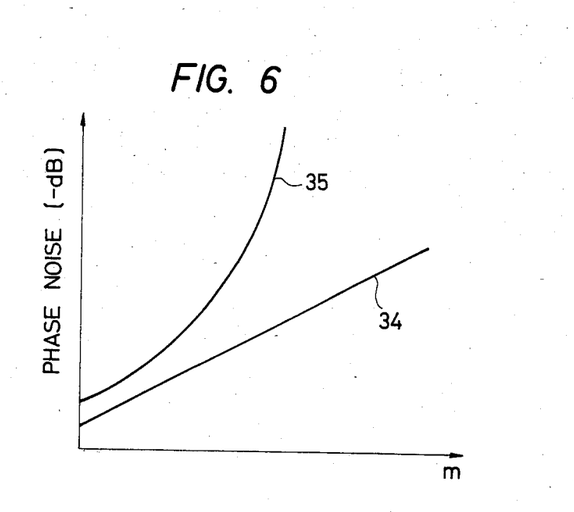
FIG. 6 is a graph showing a comparison of phase noises in the present invention and in the prior art.

Accordingly, the phase noise of frequency transformer 12 is smaller, by $20.8 - 13.2 = 7.6$ dB, than in the case where the reference signal is directly multiplied by $m=11$. In this instance, the larger the multiplication factor is, the more the noise reducing effect is heightened. As shown in FIG. 6, the phase noise of the frequency transformer 12 depicted in FIG. 5 increases linearly with an increase in the multiplication factor m, as indicated by the curve 34, whereas when the reference signal is directly multiplied by a factor m, the phase noise abruptly increases with an increase in the factor m, as indicated by the curve 35.

Figure 7:
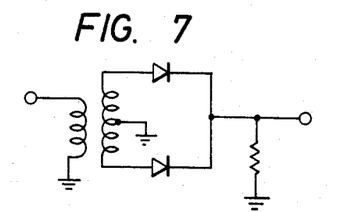
FIG. 7 is a circuit diagram illustrating an example of a multiplier 27.
Figure 8:
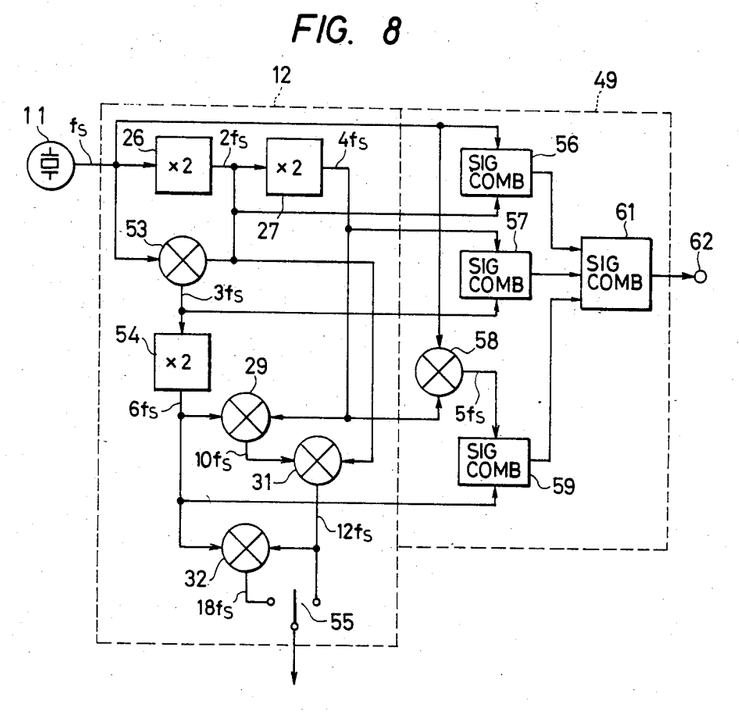
FIG. 8 is a block diagram illustrating another embodiment of the present invention.

The multiplier 27 usually has a multiplication factor $k=2$ and constituted by a full-wave rectifying frequency doubler. FIG. 7 shows an example of the full-wave rectifying frequency doubler employing diodes. It is also possible to use a full-wave rectifying frequency doubler employing transistors. The frequency transformer 12 may also be formed only by up-converters without using the multiplier 27, as indicated by the broken line in FIG. 5. In such a case, the phase noise is minimized, but each of the up-converters calls for a filter for removing spurious noise and an amplifier is sometimes needed for compensating for a conversion loss, resulting in complexity of the entire arrangement. By properly using the frequency doubler, however, the entire arrangement can be relatively simplified. In the frequency transformer 12 two inputs to each up-converter can be derived from any desired preceding stages. FIG. 8 illustrates, by way of example, a specific arrangement in which the reference signal frequency $f_s$ is 200 MHz and the frequency transformer 12 outputs $12f_s$ 2400 MHz and $18f_s = 3600$ MHz.

The reference signal from the reference signal source 11 is doubled in frequency by a frequency doubler 26 to $2f_s$, and its output is further doubled in frequency by another frequency doubler 27 to $4f_s$. The reference signal and the output of the frequency doubler 26 are applied to an up-converter 53, providing therefrom an output of a frequency $3f_s$. This output is doubled in frequency by a frequency doubler 54 to a frequency $6f_s$, and its output is provided to an up-converter 29, along with the output of the frequency doubler 27, obtaining an output of a frequency $10 f_s$. This output and the output of the frequency doubler 26 are supplied to an up-converter 31, from which an output of a frequency $12f_s$ is obtained. This output and the output of the frequency doubler 54 are applied to an up-converter 32, creating an output of a frequency $18f_s$. The signal of the frequency $12f_s = 2400$ MHz from the up-converter 31 and the signal of the frequency $18f_s = 3600$ MHz from the up-converter 32 are selectively provided as the output of the frequency transformer 12 via a switch 55. Employing this arrangement of the frequency transformer 12 in the embodiment of FIG. 3, there can be obtained at the output terminal 18 a signal of high frequency purity which varies by steps of 200 MHz in the range of 1800 to 4200 MHz and has a phase noise of $-135$ dB or less.

In the example shown in FIG. 3 the low-order multiplier 13 is employed in the side band signal generator 49. The low-order multiplier 13 comprises a power amplifier for sufficiently amplifying the input signal thereto and a step recovery diode for receiving the amplified large-amplitude signal and creating, simultaneously, many harmonic frequencies based on the nonlinear input-output characteristic of the diode. Thus, the multiplier is capable of generating many harmonic frequencies at a time, but also multiplies the phase noise of the input signal, as mentioned before, and requires a power amplifier.

The side band signal generator 49 may also be formed by a combination of up-converters and frequency doublers (or multipliers) as shown in FIG. 8, where many of them are shared with those in the frequency transformer 12. The reference signal and the output of the multiplier 26 are combined by a signal combiner 56, the outputs of the multiplier 27 and the up-converter 53 are combined by a signal combiner 57, and the output of the multiplier 27 and the reference signal are provided to an up-converter 58, obtaining therefrom an output of a frequency $5f_s$. This output and the output of the multiplier 54 are combined by a signal combiner 59. The outputs of the signal combiners 56, 57 and 59 are combined by a signal combiner 61 and the combined output is provided as the output of the side band signal generator 49 to a terminal 62. The signal frequencies that are derived at the terminal 62 are $f_s$, $2f_s$, $3f_s$, $4f_s$, $5f_s$, and $6 f_s$.

Setting the reference signal frequency $f_s$ to 200 MHz and the output frequency $f_1$ of the frequency transformer 12 in FIG. 3 to $12f_s = 2400$ MHz and selecting, by the variable filter 16, those frequencies $f_1 - 3f_s$, $f_1 - 2f_s$, $f_1 - f_s$, $f_1$, $f_1 + f_s$, $f_1 + 2f_s$ and $f_1 + 3f_s$, the output frequencies at the output terminal 18 are 1800, 2000, 2200, 2400, 2600, 2800 and 3000 MHz. Furthermore, setting the frequency $f_1$ to $18f_s = 3600$ MHz and selecting, by the variable filter 16, those frequencies $f_1 - 2f_s$, $f_1 - f_s$, $f_1$, $f_1 + f_s$, $f_1 + 2f_s$, $f_1 + 3f_s$ and $f_1 + 4f_s$, the output frequencies at the output terminal 18 are 3200, 3400, 3600, 3800, 4000 and 4200 MHz.

Figure 9:
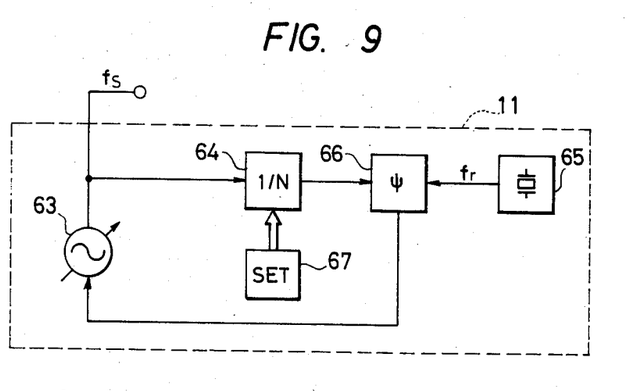
FIG. 9 is a block diagram illustrating a variable frequency reference signal source 11 in the variable frequency synthesizer of the present invention.
Figure 10:
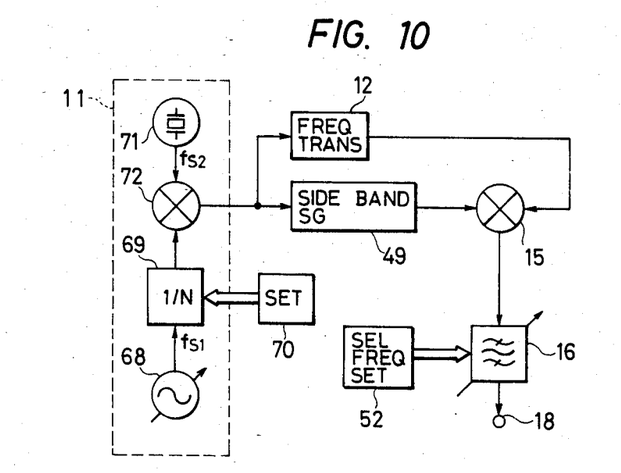
FIG. 10 is a block diagram illustrating another embodiment of the present invention.

While in the above the variable frequency synthesizer 51 of the present invention has been described to be used as the variable frequency synthesizer 20 in FIG. 1, the frequency synthesizer creates signals of various frequencies in itself, and hence can be used independently. In such an instance, the frequency of the reference signal from the reference signal source 11 is varied so that the frequency $(m \pm n_i)f_s$ may take various values at small intervals. The reference signal frequency $f_s$ of the reference signal source 11 can be varied in such a manner as follows. For example, as shown in FIG. 9, the output of a voltage-controlled variable oscillator 63 is frequency divided by a frequency divider 64 down to 1/N and the frequency-divided output is phase compared by a phase comparator 66 with a reference signal of a frequency $f_r$ from a reference oscillator 65. The phase-compared output is applied to the variable oscillator 63 to control its oscillation frequency so that $f_s/N = f_r$, and the frequency dividing number N of the frequency divider 64 is changed by a setting circuit 67. Alternatively, as shown in FIG. 10, an output frequency $f_{s1}$ from a variable oscillator 68 is frequency divided by a frequency divider 69 down to 1/N, and the frequency-divided output and an output frequency $f_{s2}$ from a reference oscillator 71 are supplied to a frequency mixer 72. An output frequency $(f_{s2} + f_{s1}/N)$ from the frequency mixer 72 is provided to both the frequency transformer 12 and the side band signal generator 49. The frequency dividing number N of the frequency divider 69 is set to $(m + n_i)$ relative to the frequency $(m + n_i)f_s$ that is selected by the variable filter 16. At this time, the variable filter 16 produces an output of a frequency $(m + n_i)f_s = (m + n_i)(f_{s2} + f_{s1}/N) = (m + n_i)f_{s2} + f_{s1}$. Accordingly, a variation in the oscillation frequency $f_{s1}$ of the variable oscillator 68 will directly appear as a frequency variation of the output at the output terminal 18.

Figure 11:
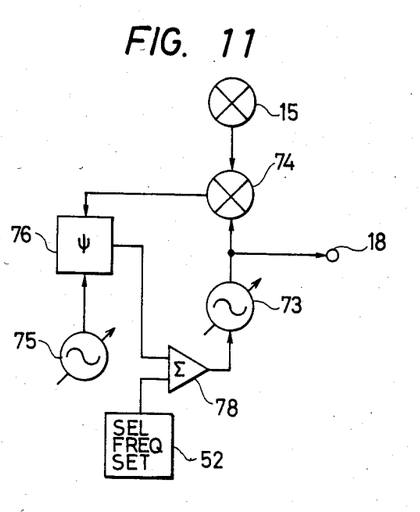
FIGS. 11 and 12 are block diagrams illustrating examples of a variable filter 16 used in FIG. 10.
Figure 12:
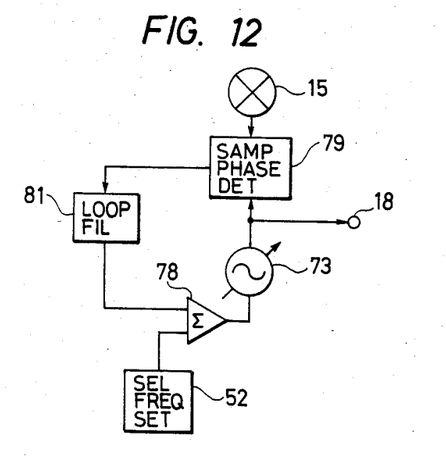

A tracking filter can also be employed as the variable filter 16. For instance, as shown in FIG. 11, the output of the frequency mixer 15 is frequency converted by a frequency mixer 74 with the output of a voltage-controlled variable oscillator 73. The converted output is phase compared by a phase comparator 76 with the output of a signal generator 75. The phase-compared output is added by an adder 78 to the output of a selective frequency setting circuit 52. The added output is applied to the variable oscillator 73 to control its frequency, thereby varying the output frequency of the signal generator 75 and the set frequency of the selective frequency setting circuit 52 to set the output frequency of the variable oscillator 73, i.e. the frequency that is provided to the terminal 18. It is also possible as shown in FIG. 12 to supply the outputs of the frequency mixer 15 and the voltage-controlled variable oscillator 73 to a sampling phase detector 79 and to supply its output via a loop filter 81 to the adder 78. Incidentally, the output of each phase comparator 23, 46, 66, 76 in FIGS. 1, 2, 3, 9 and 11 is supplied to a loop filter in practice, but it is not illustrated for the sake of brevity.

It will be apparent that many modifications and variations may be effected without departing from the scope of the novel concepts of the present invention.

What is claimed is:

1. A variable frequency synthesizer comprising:
   a reference signal source for generating a reference signal of a frequency $f_s$;
   frequency transforming means supplied with the reference signal from the reference signal source for increasing the frequency of the reference signal, said frequency transforming means including a plurality of up-converters, wherein an output of frequency $f_1 = mf_s$ is produced, where m is an integer equal to or greater than 3;
   side band signal generating means supplied with the reference signal from the reference signal source for outputting n signals of frequencies $f_s, 2f_s, 3f_s, \ldots$ and $nf_s$, wherein n is a positive integer smaller than m, and the degree of generation of phase noise by the side band signal generating means equal to or lower than the degree of generation of phase noise by the frequency transforming means;
   a frequency mixer for frequency mixing the output signals of the side band signal generating means and the output of the frequency transforming means; and
   a variable filter for selecting one frequency component $(m \pm n_i)f_s$ from the output of the frequency mixer, wherein, $n_i = 0, 1, 2 \ldots n$.

2. A variable frequency synthesizer according to claim 1 wherein the frequency transforming means includes at least one full-wave rectifying frequency doubler receiving, as its input, one of the reference signals and the output of one of said up-converters, and is arranged so that the input reference signal, the outputs of the up-converters and the output of the frequency doubler are combined to sequentially raise the input reference signal frequency $f_s$.

3. A variable frequency synthesizer according to claim 2 wherein the side band signal generating means comprises a frequency multiplier receiving the reference signal and generating a plurality of its harmonics at the same time, and a low-pass filter for selectively deriving any of the frequencies $f_s, 2f_s, 3f_s, \ldots$ and $nf_s$ from the output of the frequency multiplier.

4. A variable frequency synthesizer according to claim 2 wherein the side band signal generating means comprises plural further up-converters for increasing the input reference signal frequency through use of a further up-converter to obtain the outputs of said frequencies $f_s, 2f_s, 3f_s \ldots$ and $nf_s$.

5. A variable frequency synthesizer according to claim 4 wherein the side band signal generating means includes at least one further full-wave rectifying frequency doubler receiving one of the reference signal and the output of one of said further up-converters and is arranged so that the input reference signal, the outputs of said further up-converter and the output of the further frequency doubler are combined to sequentially provide signals with frequencies increasing from the reference signal frequency.

6. A variable frequency synthesizer according to claim 2 wherein the side band signal generating means has signal combiner means for receiving the various frequency components obtained from various internal stages of the frequency transforming means and combining the receiving outputs into a composite output.

7. A variable frequency synthesizer according to claim 1, 2, 3, 4 or 6 further including a second frequency mixer supplied with the output of the variable filter, a variable reference signal generator capable of changing the frequency of its output signal, a phase comparator for phase comparing the output signal of the variable reference signal generator and the output of the second frequency mixer, and a voltage-controlled variable oscillator controlled in oscillation frequency by the output of the phase comparator and supplying its output to the second frequency mixer.

8. A variable frequency synthesizer according to claim 7 further including a selective frequency setting means for producing a DC output corresponding to a set frequency substantially representing the frequency of the output of the voltage-controlled variable oscillator, and an adder for adding together the DC output of the selective frequency setting means and the output of the phase comparator and supplying the added output as a control signal to the voltage-controlled variable oscillator.

9. A variable frequency synthesizer according to claim 1, 2, 3, 4 or 6 wherein the reference signal source is a variable reference signal source capable of changing the frequency of its reference signal.

10. A variable frequency synthesizer according to claim 9 wherein the variable reference signal source comprises a voltage-controlled variable oscillator, a reference signal generator for generating a reference signal of a predetermined frequency, a frequency divider for frequency dividing the output of the voltage-controlled variable oscillator by a set frequency dividing integer number N, and a phase comparator for phase comparing the frequency-divided output with the reference signal from the reference signal generator and for controlling the oscillation frequency of the voltage-controlled variable oscillator with the phase-compared output, the output of the voltage-controlled variable oscillator being used as the output of the variable reference signal source of said frequency $f_s$.

11. A variable frequency synthesizer according to claim 9 wherein the variable reference signal source comprises a frequency variable oscillator, a frequency divider for frequency dividing the output of the variable oscillator by a set frequency dividing number N, a reference signal generator, and a frequency converter supplied with the outputs of the reference signal generator and the frequency divider, for frequency mixing them and providing the mixed output as the reference signal of frequency $f_s$, the frequency dividing number N of the frequency divider being selected to be equal to $(m \pm n_i)$ in correspondence to the frequency component $(m \pm n_i)f_s$ derived from the variable filter.

12. A variable frequency synthesizer according to claim 11 wherein the variable filter is a tracking filter.

13. A variable frequency synthesizer according to claim 1, 2, 3, 4 or 6, wherein the variable filter comprises a second frequency mixer supplied with the output of the first frequency mixer, a variable reference signal generator capable of changing the frequency of its output signal, a phase comparator for phase comparing the output signal of the variable reference signal generator and the output of the second frequency mixer, and a voltage-controlled variable oscillator controlled in oscillation frequency by the output of the phase comparator and supplying its output to the second frequency mixer, the output from the voltage-controlled variable oscillator being provided as the output of the variable filter.

14. A variable frequency synthesizer according to claim 3, wherein said frequency multiplier is of a low order with $N \leq 10$.

15. A variable frequency synthesizer according to claim 14, wherein $n \leq 7$.

16. A variable frequency synthesizer according to claim 1, wherein the phase noise of said frequency transformer is not greater than a limit of 20 log m DB.

17. A variable frequency synthesizer according to claim 16, wherein said frequency transforming means includes a multiplier of low order for multiplying said reference signal of frequency $f_s$ by a sufficiently low integer to be consistent with said limit for said phase noise.

18. A variable frequency synthesizer according to claim 1, wherein said frequency transforming means does not include a frequency multiplier.

19. A variable frequency synthesizer according to claim 4 or 5, wherein at least one of said up-converters of said frequency transforming means is used in common with one of the said further up-converters of said side band signal generating means.

20. A variable frequency synthesizer according to claim 5, wherein said frequency doubler of said frequency transforming means is used in common with further frequency doubler of said side band signal generating means.

* * * * *

UNITED STATES PATENT AND TRADEMARK OFFICE
CERTIFICATE OF CORRECTION

PATENT NO. : 4,602,220
DATED : 22 July 1986
INVENTOR(S) : KURIHARA

It is certified that error appears in the above-identified patent and that said Letters Patent is hereby corrected as shown below:

```
Column 1, line 68, "by" should be --be--.
Column 4, line 61, after "log" (second occurrence) insert
--m² + 10 log--.
Column 5, line 17 (line numbering is off)
after "k=2 and" insert --is--;
         line 35, "12f_s 2400" should be --12f_s = 2400--.
Column 7, line 45, after "means" insert --is--.
```

Signed and Sealed this

Twenty-eighth Day of October, 1986

[SEAL]

Attest:

DONALD J. QUIGG

Attesting Officer     Commissioner of Patents and Trademarks